United States Patent
Lai et al.

(10) Patent No.: US 11,133,813 B2
(45) Date of Patent: Sep. 28, 2021

(54) ANALOG TO DIGITAL CONVERTER DEVICE AND NOISE SHAPING DIGITAL SLOPE ANALOG TO DIGITAL CONVERTER CIRCUITRY

(71) Applicant: REALTEK SEMICONDUCTOR CORPORATION, Hsinchu (TW)

(72) Inventors: Jie-Fan Lai, Hsinchu (TW); Shih-Hsiung Huang, Hsinchu (TW); Yu-Chang Chen, Hsinchu (TW); Chih-Lung Chen, Hsinchu (TW); Tzu-Hao Hung, Hsinchu (TW); Tai-Cheng Lee, Taipei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 2 days.

(21) Appl. No.: 16/848,133

(22) Filed: Apr. 14, 2020

(65) Prior Publication Data

US 2021/0099183 A1    Apr. 1, 2021

(30) Foreign Application Priority Data

Sep. 27, 2019   (TW) ................. 108135259

(51) Int. Cl.
*H03M 1/10*   (2006.01)
*H03M 1/08*   (2006.01)

(52) U.S. Cl.
CPC ........... *H03M 1/08* (2013.01); *H03M 1/1009* (2013.01)

(58) Field of Classification Search
CPC .......... H03M 1/468; H03M 1/46; H03M 1/12; H03M 1/1245; H03M 1/145; H03M 1/804;

(Continued)

(56) References Cited

U.S. PATENT DOCUMENTS 5,990,815 A * 11/1999 Linder ................ H03M 1/0641
                                                    341/131
8,102,292 B1 * 1/2012 Van Ess ................ H03M 3/426
                                                    341/143

(Continued)

FOREIGN PATENT DOCUMENTS

| CN | 107786208 A  | 3/2018 |
| TW | 201916599 A  | 4/2019 |
| WO | 2013098785 A2 | 7/2013 |

OTHER PUBLICATIONS

By Chun-Chen Liu et al. "A 12 bit 100 MS/s SAR-Assisted Digital-Slope ADC," in IEEE Journal of Solid-State Circuits, vol. 51, No. 12, pp. 2941-2950, Dec. 2016. (Year: 2016).*

(Continued)

*Primary Examiner* — Linh V Nguyen
(74) *Attorney, Agent, or Firm* — WPAT, PC

(57) ABSTRACT

An analog-to-digital converter (ADC) device includes an ADC circuitry and a digital slope ADC circuitry. The ADC circuitry is configured to generate first bits and a first voltage according to an input signal. The digital slope ADC circuitry is configured to generate a second voltage at a node according to the first voltage and to gradually adjust the second voltage to generate second bits. After the second bits are generated, the digital slope ADC circuitry is further configured to perform a noise shaping function according to a first residual signal of the node.

20 Claims, 5 Drawing Sheets

(58) Field of Classification Search
CPC .... H03M 1/1071; H03M 1/462; H03M 1/466; H03M 3/464; H03M 3/378; H03M 1/005; H03M 1/1019; H03M 1/1215; H03M 1/164; H03M 1/1038; H03M 1/38; H03M 1/1009; H03M 1/168; H03M 1/74; H03M 1/0607; H03M 3/458; H03M 1/08
USPC .......................... 341/118–121, 155, 161, 172
See application file for complete search history.

(56) References Cited

U.S. PATENT DOCUMENTS

| | | | | |
|---|---|---|---|---|
| 9,197,240 | B1* | 11/2015 | Kinyua | H03M 1/1265 |
| 9,735,797 | B2* | 8/2017 | Zhao | H03M 1/46 |
| 9,838,031 | B2 | 12/2017 | Dong et al. | |
| 10,181,860 | B1* | 1/2019 | Patil | H03M 1/06 |
| 10,256,834 | B1 | 4/2019 | Kinyua | |
| 2016/0352351 | A1* | 12/2016 | Miki | H03M 1/0626 |
| 2017/0126239 | A1* | 5/2017 | Sun | H03M 1/46 |
| 2017/0317683 | A1* | 11/2017 | Bandyopadhyay ... | H03M 3/426 |
| 2019/0207620 | A1* | 7/2019 | Lee | H03M 3/494 |
| 2020/0228132 | A1* | 7/2020 | Huang | H03M 1/468 |

OTHER PUBLICATIONS

Chun-Chen Liu et al. "A 12 bit 100 MS/s SAR-Assisted Digital-Slope ADC," in IEEE Journal of Solid-State Circuits, vol. 51, No. 12, pp. 2941-2950, Dec. 2016. (Year: 2016).*
OA letter of the counterpart TW application (appl. No. 108135259) dated Apr. 29, 2020. Summary of the OA letter: 1. Claim 1 is rejected as allegedly being unpatentable over the cited reference 1 in view of the cited reference (TW 201916599 A, also published as U.S. Appl. No. 10/256,834 B1). 2. Claims 2-10 are allowable.
Pieter J. A. Harpe et al, "A 0.8-mW 5-bit 250-MS/s Time-Interleaved Asynchronous Digital Slope ADC," in IEEE Journal of Solid-State Circuits, vol. 46, No. 11, pp. 2450-2457, Nov. 2011.
J. A. Fredenburg et al, "A 90-MS/s 11-MHz-Bandwidth 62-dB SNDR Noise-Shaping SAR ADC," in IEEE Journal of Solid-State Circuits, vol. 47, No. 12, pp. 2898-2904, Dec. 2012.
C. Liu et al, "A 12 bit 100 MS/s SAR-Assisted Digital-Slope ADC," in IEEE Journal of Solid-State Circuits, vol. 51, No. 12, pp. 2941-2950, Dec. 2016.
Taiwan Intellectual Property Office, Office Action letter of the counterpart TW application (appl. No. 108135259) dated Feb. 24, 2020. English Summary of the OA letter on p. 1.

* cited by examiner

ANALOG TO DIGITAL CONVERTER DEVICE AND NOISE SHAPING DIGITAL SLOPE ANALOG TO DIGITAL CONVERTER CIRCUITRY

BACKGROUND OF THE INVENTION

1. Field of the Invention

The present disclosure relates to an analog to digital converter (ADC), especially to a digital slope ADC having a noise shaping function.

2. Description of Related Art

An analog to digital converter (ADC) has been widely utilized in various electronic devices, in order to generate a digital signal for subsequent processing. In practical applications, a trade-off has to be made between a performance of the ADC, e.g., resolution, low noises, high and bandwidth, and power consumption. However, the current ADC is insufficient to meet strict requirements of high performance and low power consumption.

SUMMARY OF THE INVENTION

In some embodiments, an analog-to-digital converter (ADC) device includes an ADC circuitry and a digital slope ADC circuitry. The ADC circuitry is configured to generate a multiple first bits and a first voltage according to an input signal. The digital slope ADC circuitry is configured to generate a second voltage at a node according to the first voltage and to gradually adjust the second voltage to generate multiple second bits. After the second bits are generated, the digital slope ADC circuitry is further configured to perform a noise shaping function according to a first residual signal of the node.

In some embodiments, a digital slope ADC circuitry includes a slope generator circuit, a delay line circuit, a comparator circuit, and a noise shaping circuit. The slope generator circuit is configured to output a voltage at a node according to a clock signal and an input signal. The delay line circuit is configured to generate multiple first bits according an enable signal and a valid signal, and to generate multiple switching signals to the slope generator circuit, in order to gradually adjust the voltage. The comparator circuit is configured to detect a zero crossing point of the voltage, in order to generate the valid signal. The noise shaping circuit is configured to output a second residue signal to the comparator circuit according to a first residue signal of the node after the first bits are generated, in order to perform a noise shaping function.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals. As used herein, the term "and/or" includes any and all combinations of one or more of the associated listed items.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

For ease of understanding, like elements in various figures are designated with the same reference numbers.

Figure 1:
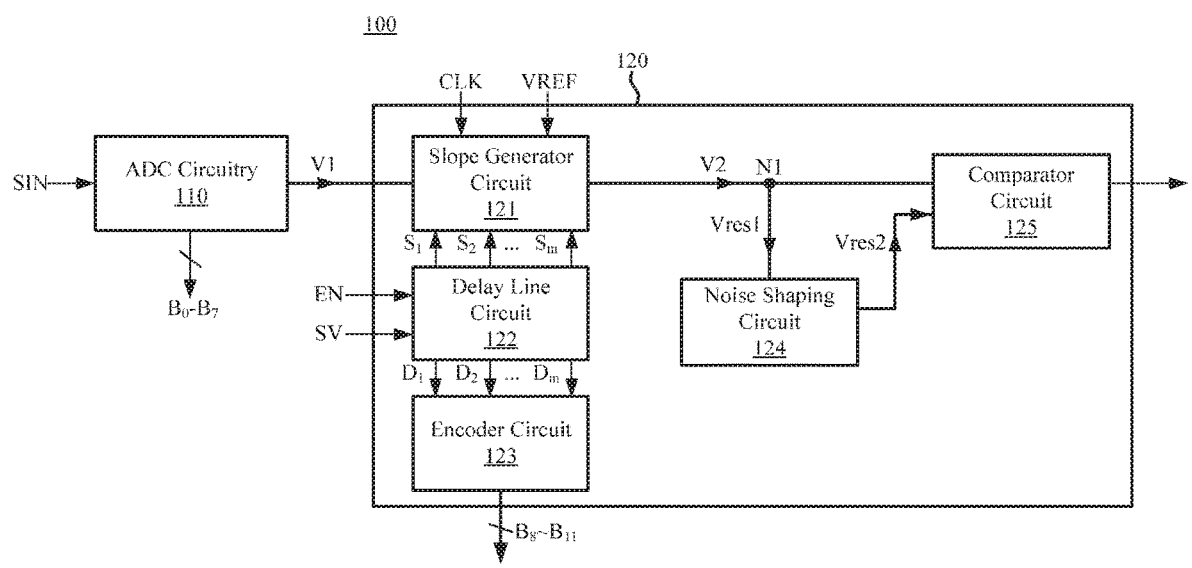
FIG. 1 illustrates a schematic diagram of an analog-to-digital converter (ADC) device according to some embodiments of the present disclosure.

FIG. 1 illustrates a schematic diagram of an analog-to-digital converter (ADC) device 100 according to some embodiments of the present disclosure. The ADC device 100 includes an ADC circuitry 110 and a digital slope ADC circuitry 120.

The ADC circuitry 110 generates bits $B_0$-$B_7$ and a voltage V1 according to an input signal SIN. In some embodiments, the ADC circuitry 110 is a successive approximation register (SAR) ADC. For example, the ADC circuitry 110 may include a capacitor array (not shown), a comparator circuit (not shown), and a control logic circuit (not shown). The capacitor array is for sampling the input signal SIN and generating a reference signal under the control of the control logic circuit. The comparator circuit is for comparing the sampled input signal SIN with the reference signal to generate a corresponding bit of the bits $B_0$-$B_7$. In response to this corresponding bit, the control logic circuit performs an algorithm to generate a control signal to the capacitor array, in order to update the reference signal. By repeatedly performing the above operations, the ADC circuitry 110 is able to generate the bits $B_0$-$B_7$. In some other embodiments, the ADC circuitry 110 may be other types of ADC.

After the bits $B_0$-$B_7$ are generated, the ADC circuitry 110 transmits the voltage V1 to the digital slope ADC circuitry 120. In some embodiments, the voltage V1 may be a voltage difference between the sampled input signal SIN and an analog voltage corresponding to the bits $B_0$-$B_7$. In some embodiments, the voltage V1 is a voltage corresponding to residue charges on the capacitor array after the bits $B_0$-$B_7$ are generated. In some embodiments, the algorithm may be a binary search algorithm. In some embodiments, the algorithm may be a non-binary search algorithm.

The digital slope ADC circuitry 120 is configured to generate a voltage V2 at a node N1 according to the voltage V1, and to gradually adjust (e.g., reduce or increase) the voltage V2 to generate bits $B_8$-$B_{11}$. After the bits $B_8$-$B_{11}$ are generated, the digital slope ADC circuitry 120 is further configured to perform a noise shaping function according to a residue signal Vres1 of the node N1.

In some embodiments, the digital slope ADC circuitry 120 includes a slope generator circuit 121, a delay line circuit 122, an encoder circuit 123, a noise shaping circuit 124, and a comparator circuit 125. The slope generator circuit 121 receives the voltage V1 according to a clock signal CLK, and outputs the voltage V1 to the node N1 as the voltage V2. The slope generator circuit 121 further gradually adjusts the voltage V2 according to a reference voltage VREF and switching signals $S_1$-$S_m$. The delay line circuit 122 generates the switching signals $S_1$-$S_m$ and bits $D_1$-$D_m$ according to an enable signal EN and a valid signal SV.

The encoder circuit 123 encodes the bits $D_1$-$D_m$ as the bits $B_8$-$B_{11}$. In some embodiments, the bits $D_1$-$D_m$ are thermometer codes, and the bits $B_0$-$B_{11}$ are binary codes. In some embodiments, the bits $B_0$-$B_{11}$ are a digital signal corresponding to the input signal SIN, in which the bits $B_0$-$B_7$ are most significant bits (MSB), and the bits $B_8$-$B_{11}$ are least significant bits (LSB). In some embodiments, the encoder circuit 123 may be implemented with one or more digital logic circuits.

The comparator circuit 125 is configured to compare the voltage V2 with a predetermined voltage (e.g., which may be, but not limited to, a ground voltage or a common mode voltage) to detect a zero crossing point of the voltage V2, in order to generate the valid signal SV. In some embodiments, the comparator circuit 125 is configured to be a continuous time comparator, in order to have lower noises. When the voltage V2 is higher than the ground voltage, the comparator circuit 125 outputs the valid signal SV having a first logic value (e.g., a logic value of 0). When the voltage V2 is lower than or equal to the ground voltage (i.e., the zero crossing point of the voltage V2 occurs), the comparator circuit 125 outputs the valid signal SV having a second logic value (e.g., a logic value of 1).

Figure 2:
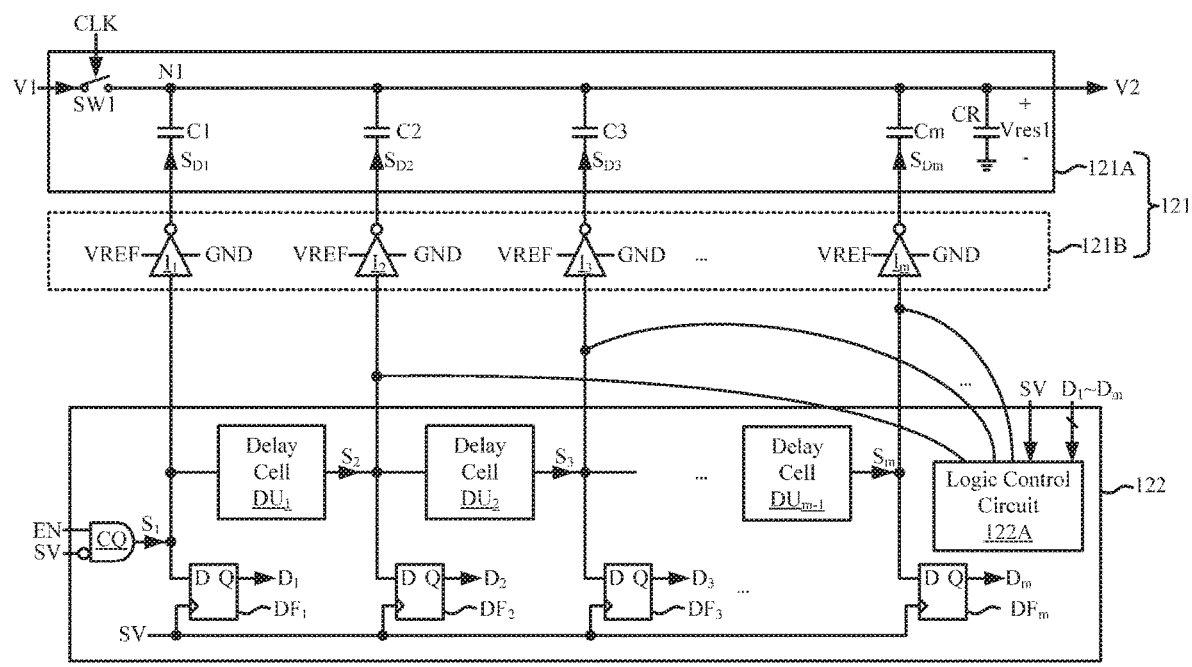
FIG. 2 illustrates a schematic diagram of the slope generator circuit and the delay line circuit in FIG. 1 according to some embodiments of the present disclosure.

After the bits $B_8$-$B_{11}$ are generated, the noises shaping circuit 124 receives the residue signal Vres1, and outputs a residue signal Vres2 to the comparator circuit 125 according to the residue signal Vres1, in order to perform the noise shaping function. In some embodiments, the residue signal Vres1 may be a difference between the voltage V2 and an analog voltage corresponding to the bits $B_8$-$B_{11}$. In some embodiments, the residue signal Vres1 is a voltage corresponding to residue charges on a capacitor array 121A (as shown in FIG. 2) after the bits $B_8$-$B_{11}$ are generated. The noise shaping function is to feedback quantized noise(s) of the comparator circuit 125 to the input of the comparator circuit 125. As a result, the noise(s), at lower frequency band, of the digital slope ADC circuitry 120 can be reduced, in order to have a better signal-to-noise ratio. In some embodiments, the comparator circuit 125 is configured to (based on the polarity) detect the zero crossing point of "a sum of the voltage V2 and the residue signal Vres2" or that of "a difference between the voltage V2 and the residue signal Vres2." In some embodiments, the residue signal Vres1 may be the same as the residue signal Vres2. In some embodiments, the residue signal Vres2 may be a charge sharing result of at least two capacitors that is generated based on the residue signal Vres1. In some embodiments, the residue signal Vres2 may be an integral result of the residue signal Vres1.

In some embodiments, the ADC device 100 may only include the digital slope ADC circuitry 120. Under this condition, the digital slope ADC circuitry 120 directly converts the input signal SIN (i.e., the input signal SIN is directly inputted into the slope generator circuit 121) to bits (e.g., bits $B_8$-$B_{11}$ or more bits).

FIG. 2 illustrates a schematic diagram of the slope generator circuit 121 and the delay line circuit 122 in FIG. 1 according to some embodiments of the present disclosure. The slope generator circuit 121 includes a capacitor array 121A and a switching circuit 121B. The capacitor array 121A includes a switch SW1, capacitors C1-Cm, and a capacitor CR. A first terminal of the switch SW1 is coupled to the ADC circuitry 110 in FIG. 1 to receive the voltage V1. A second terminal of the switch SW1, first terminals of capacitors C1-Cm, and a first terminal of the capacitor CR are coupled to the node NE When the switch SW1 is turned on according to the clock signal CLK, the voltage V1 is transmitted to the capacitor C1-Cm and is stored as the voltage V2.

Second terminals of the capacitors C1-Cm receive control signals $S_{D1}$-$S_{Dm}$ respectively. Before the digital slope ADC circuitry 120 performs the analog to digital (A/D) conversion, the enable signal EN is set to have the logic value of 0, and the control signals $S_{D1}$-$S_{Dm}$ are configured to be at a high level (e.g., a level of the reference voltage VREF). Before the A/D conversion is performed, the level of the node N1 (i.e., voltage V2) is shifted to a higher level (as shown by operations during an interval P1 in the following FIG. 3) based on the voltage V1 and the control signals $S_{D1}$-$S_{Dm}$, in order to assure that the voltage V2 is initialized to beat a proper operation range of the digital slope ADC circuitry 120. The capacitor CR is configured to store residue charges on the capacitors C1-Cm as the residue signal Vres1 after the bits $B_8$-$B_{11}$ are generated. The capacitance values of the capacitors C1-Cm are the same as each other. In some embodiments, a capacitance value of the capacitor CR may be the same as or different from (e.g., lower than) the capacitance value of any one of the capacitors C1-Cm.

The switching circuit 121B is configured to generate the control signals $S_{D1}$-$S_{Dm}$ according to the switching signals $S_1$-$S_m$. The switching circuit 121B includes inverters $I_1$-$I_m$. Each of the inverters $I_1$-$I_m$ receives a corresponding one of the switching signals $S_1$-$S_m$ and generates a corresponding one of the control signals $S_{D1}$-$S_{Dm}$. Moreover, the inverters $I_1$-$I_m$ further receive the reference voltage VREF and a ground voltage GND, in order to set the high level and the low level of the control signals $S_{D1}$-$S_{Dm}$, in which the reference voltage VREF is higher than the ground voltage GND.

Taking the inverter $I_1$ as an example, the inverter $I_1$ receives the switching signal $S_1$ and generates the control signal $S_{D1}$ according to the switching signal $S_1$. If the switching signal $S_1$ has the low level, the inverter $I_1$ generates the control signal $S_{D1}$ having the high level (i.e., the level of the reference voltage VREF); alternatively, if the switching signal $S_1$ has the high level, the inverter $I_1$ generates the control signal $S_{D1}$ having the low level (i.e., the level of the ground voltage GND). With this analogy, operations of the remaining inverters $I_2$-$I_m$ can be understood, and thus the repetitious descriptions are not given.

The delay line circuit 122 includes a logic control circuit 122A, a logic gate CQ, delay cells $DU_1$-$DU_{m-1}$, and flip flops $DF_1$-$DF_m$. In some embodiments, the logic control circuit 122A is configured to calibrate the voltage V2 before the noise shaping function is performed, in order to reduce impact(s) from practical circuit delay. Descriptions regarding operations herein are given below with reference to FIG. 3. In some embodiments, the logic control circuit 122A may be implemented with a digital circuit, a microcontroller, a digital signal processor circuit, and/or a state machine, but the present disclosure is not limited thereto.

The logic gate CQ is configured to generate the switching signal $S_1$ according to the enable signal EN and the valid signal SV. In this example, the logic gate CQ may be a AND gate having an inverting input terminal, and this inverting input terminal receives the valid signal SV, and another input terminal of the AND gate receives the enable signal EN.

The delay cells $DU_1$-$DU_{m-1}$ are coupled in series, in order to sequentially generate the remaining switching signals $S_2$-$S_m$ according to the switching signal $S_1$. The delay cell $DU_1$ generates the switching signal $S_2$ according to the switching signal $S_1$. The delay cell $DU_2$ generates the switching signal $S_3$ according to the switching signal $S_2$. By this analogy, the delay cell $DU_{m-1}$ generates the switching signal $S_m$ according to the switching signal $S_{m-1}$ (not shown). In some embodiments, each of the delay cells $DU_1$-$DU_{m-1}$ may be implemented with logic gates (e.g., AND gate and inverter) that are coupled in series, in order to delay the received switching signal by a predetermined time to generate a next switching signal.

In some embodiments, the flip flops $DF_1$-$DF_m$ may be D-type flip flops. Each of the flip flops $DF_1$-$DF_m$ receives a corresponding one of the switching signals $S_1$-$S_m$, and outputs the received signal as a corresponding one of the bits $D_1$-$D_m$. Taking the flip flop $DF_1$ as an example, the flip flop $DF_1$ is triggered by the valid signal SV, in order to output the switching signal $S_1$ as the bit $D_1$. With this analogy, operations of the remaining flip flops $DF_2$-$DF_m$ can be understood, and thus the repetitious descriptions are not given.

The aforementioned circuit configurations and numbers of circuits/signals/bits are given for illustrative purposes, and the present disclosure is not limited thereto. For example, in some embodiments, the delay line circuit 122 may include more flip flops (not shown). These flip flops receive signals associated with the switching signals from the delay cells $DU_1$-$DU_{m-1}$ according to the valid signal SV, in order to generate more bits to the encoder circuit 123. With more bit information, the encoder circuit 123 is able to generate the more accurate bits $B_8$-$B_{11}$. In some embodiments, the digital slope ADC circuitry 120 may further include more sets of the comparator circuits 125, more sets of the delay cells $DU_1$-$DU_{m-1}$, and more sets of the flip flops $DF_1$-$DF_m$. A configuration of each set of the comparator circuits 125, the delay cells $DU_1$-$DU_{m-1}$, and flip flops $DF_1$-$DF_m$ is the same as the configuration shown in FIG. 2, in order to generate multiple sets of the bits $D_1$-$D_m$. The encoder circuit 123 is able to generate the more accurate bits $B_8$-$B_{11}$ according to an average value of the multiple sets of the bits $D_1$-$D_m$.

Figure 3:
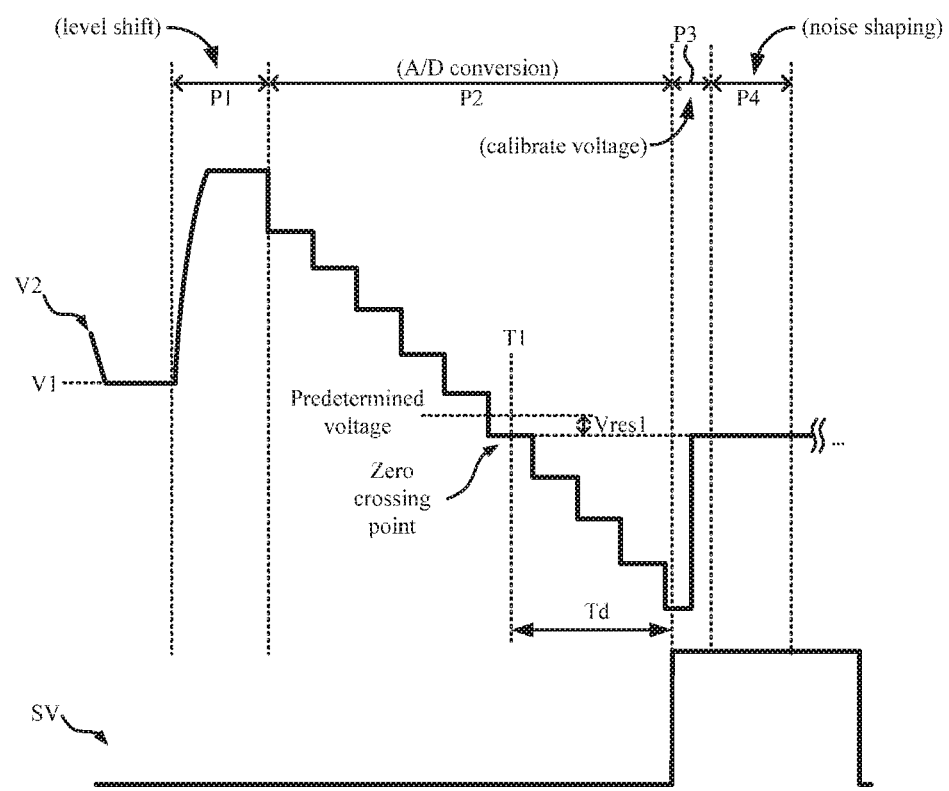
FIG. 3 illustrates a wave diagram of signals related to the digital slope ADC circuitry in FIG. 1 according to some embodiments of the present disclosure.

Reference is made to both of FIG. 2 and FIG. 3. FIG. 3 illustrates a wave diagram of signals related to the digital slope ADC circuitry 120 in FIG. 1 according to some embodiments of the present disclosure. During an interval P1 prior to the A/D conversion of the digital slope ADC circuitry 120, the switch SW1 is turned on to transmit the voltage V1 to the N1 as the voltage V2. During the interval P1, both of the enable signal EN and the valid signal SV have the logic value of 0, and thus the switching signals $S_1$-$S_m$ have the logic value of 0. As mentioned above, according to these switching signals $S_1$-$S_m$, the control signals $S_{D1}$-$S_{Dm}$ have the level of the reference voltage VREF, and the voltage V2 is thus shifted to a proper level based on the voltage V1 and the reference voltage VREF.

During an interval P2, the enable signal EN is switched to have the logic value of 1, such that the digital slope ADC circuitry 120 starts performing the A/D conversion. In response to this enable signal EN, the switching signals $S_1$-$S_m$ are sequentially switched from having the logic value of 0 to having the logic value of 1. Taking the switching signal $S_1$ as an example, when the switching signal $S_1$ is switched from having the logic value of 0 to having the logic value of 1, the control signal $S_{D1}$ is switched to have the level of the ground voltage GND. As a result, the voltage V2 is pulled down by the capacitor C1. With operations of the delay cells $DU_1$-$DU_{m-1}$, the switching signals $S_2$-$S_m$ are sequentially switched to have the logic values of 1, and thus the voltage V2 is sequentially pulled down by the capacitors C2-Cm.

At a time T1, the voltage V2 is pulled down to be lower than zero (i.e., the zero crossing point occurs). Ideally, the comparator circuit 125 instantly generates the valid signal SV having the logic value of 1. In response to this valid signal SV, the flip flops $DF_1$-$DF_m$ output the switching signals $S_1$-$S_m$ as the bits $D_1$-$D_m$. For example, when the switching signal $S_3$ is switched to have the logic value of 1, the comparator circuit 125 detects that the voltage V2 is lower than zero, and thus generates the valid signal SV having the logic value of 1. In this condition, the switching signals $S_1$-$S_3$ have the logic values of 1, and the switching signals $S_4$-$S_m$ still have the logic values of 0. As a result, the bits $D_1$-$D_m$ is "11100 . . . 0."

In practical applications, due to parasitic component(s), a delay may exist in operations of the comparator circuit 125. As shown in FIG. 3, when the zero crossing point occurs, the comparator circuit 125 generates the valid signal SV having the logic value of 1 after a delay time Td. Due to the delay time Td, the delay line circuit 122 may incorrectly switch certain of the switching signals $S_1$-$S_m$ to have the logic values of 1. As a result, the residue level (i.e., the residue signal Vres1) of the voltage V2 generated after the A/D conversion may be inaccurate.

During an interval P3, the logic control circuit 122A is able to calibrate the voltage V2, in order to reduce impacts from the delay time Td. In examples of FIG. 2, the logic control circuit 122A adjusts at least one of the switching signals $S_1$-$S_m$ which has the logic values of 1 according to the bits $D_1$-$D_m$ and the valid signal SV, in order to reset at least one corresponding capacitor of the capacitors C2-Cm. For example, the bits $D_1$-$D_m$ are "11111 . . . 0", and the bits $D_4$-$D_5$ are incorrectly switched to have the logic values of 1 due to the delay time Td. The logic control circuit 122A is able to adjust (i.e., switch back) the switching signals $S_4$-$S_5$ to have the logic values of 0, in order to reset levels of the second terminals of the corresponding capacitors C4-C5 to the reference voltage VREF. As a result, the voltage V2 is able to be calibrated to the proper level to reduce the impacts from the delay time Td. During the interval P3, the voltage V2 is stored by the capacitor CR as the residue signal Vres1.

In some embodiments, a number of the switching signals adjusted by the logic control circuit 122A may be determined by circuit simulation and/or measurement. In some embodiments, the number of the switching signals being adjusted may correspond to 4 LSBs, but the present disclosure is not limited thereto.

During an interval P4, the noise shaping circuit 124 receives the residue signal Vres1, and outputs the residue signal Vres2 to the comparator circuit 125 according to the residue signal Vres1, in order to perform the noise shaping function.

Figure 4:
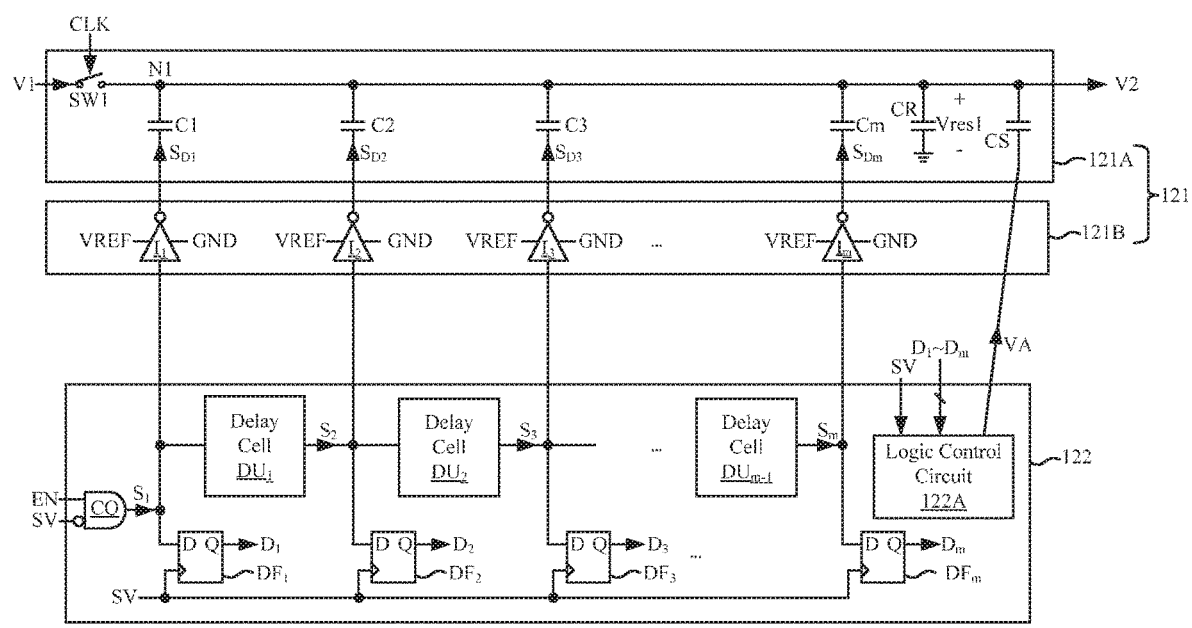
FIG. 4 illustrates a schematic diagram of the slope generator circuit and the delay line circuit in FIG. 1 according to some embodiments of the present disclosure.

FIG. 4 illustrates a schematic diagram of the slope generator circuit 121 and the delay line circuit 122 in FIG. 1, according to some embodiments of the present disclosure. Compared with FIG. 2, the capacitor array 121A in FIG. 4 further includes a compensation capacitor CS. In this example, during the interval P3, the logic control circuit 122A is configured to output an adjustment voltage VA to a second terminal of the compensation capacitor CS, in order to calibrate the voltage V2.

Figure 5:
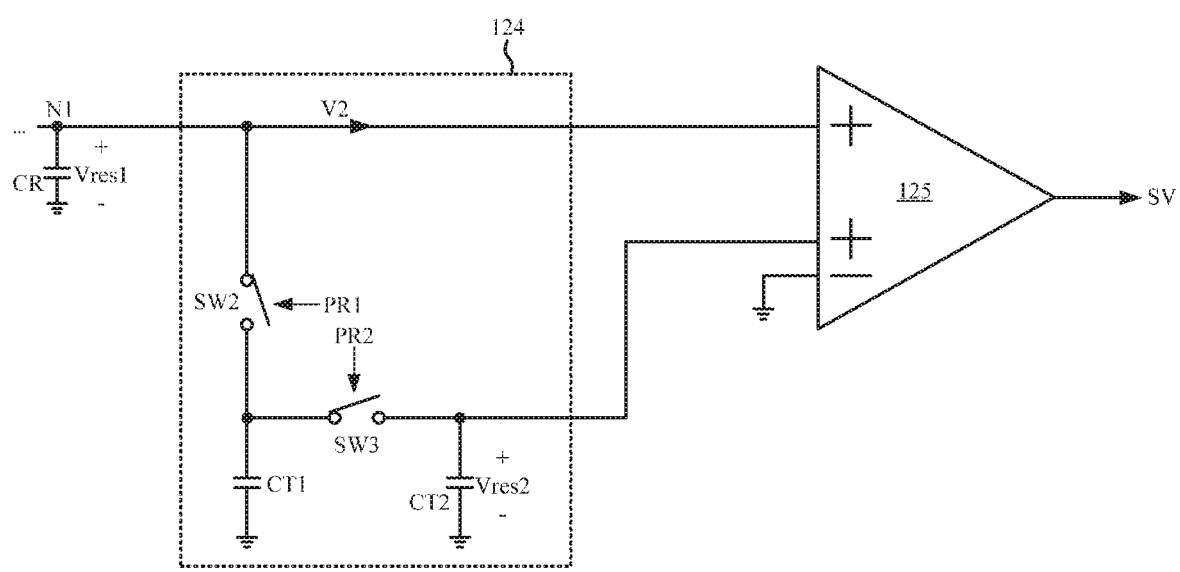
FIG. 5 illustrates a schematic diagram of the noise shaping circuit and the comparator circuit in FIG. 1 according to some embodiments of the present disclosure.

FIG. 5 illustrates a schematic diagram of the noise shaping circuit 124 and the comparator circuit 125 in FIG. 1, according to some embodiments of the present disclosure. In this example, the comparator circuit 125 includes three input terminals. A first positive input terminal is configured to receive the voltage V2, in order to detect the zero crossing point of the voltage V2. A second positive input terminal is configured to receive the residue signal Vres2, in order to perform the noise shaping function to the voltage V2. A negative input terminal is configured to receive the predetermined voltage (e.g., ground voltage).

In some embodiments, the comparator circuit 125 may include a first transistor (not shown), a second transistor (not shown), and a third transistor (not shown). The first positive input terminal is coupled to a gate of the first transistor, the second positive input terminal is coupled to a gate of the second transistor, and the negative input terminal is coupled to a gate of the third transistor. In some embodiments, a summation of a current generated from the first transistor and a current generated from the second transistor may be compared with a current generated from the third transistor, in order to generate the valid signal SV. The above configurations of the comparator circuit 125 are given for illustrative only, and the present disclosure is not limited thereto.

The noise shaping circuit 124 includes switches SW2-SW3 and capacitors CT1-CT2. A first terminal of the switch SW2 and the first positive input terminal are coupled to the node N1. A second terminal of the switch SW2 is coupled to the capacitor CT1 and a first terminal of the switch SW3. A second terminal of the switch SW3 is coupled to the capacitor CT2 and the second positive input terminal. During the interval P3, the switch SW2 is turned on (i.e., closed or conducted) according to a signal PR1, in order to transfer the residue signal Vres1 to the capacitor CT1. Then, the switch SW3 is turned on according to a control signal PR2, in order to couple the capacitor CT1 to the capacitor CT2, and to generate the residue signal Vres2 to the comparator circuit 125. In this example, the residue signal Vres2 is a charge sharing result, which is determined based on the residue signal Vres1, of the capacitors CT1 and CT2.

The above configurations of the noise shaping circuit 124 are given for illustrative purposes only, and the present disclosure is not limited thereto. In some embodiments, the noise shaping circuit 124 may be implemented with an active integrator circuit. In some embodiments, the noise shaping circuit 124 may include a switching circuit (not shown) and a capacitive circuit (not shown). The capacitive circuit may be coupled between the node N1 and the input terminal of the comparator circuit 125, and the switching circuit is selectively turned on to transfer the residue signal Vres1 to the capacitive circuit, in order to generate the residue signal Vres2. In some embodiments, the capacitive circuit may include a capacitor configured to cooperate with the switching circuit to operate as a part of the capacitor array 121A (e.g., the capacitor CR).

The above embodiments are given with examples utilizing a single-ended circuit, but the present disclosure is not limited thereto. It should be understood that, the above embodiments are able to be implemented as a differential circuit (e.g., by employing two parallel slope generator circuits 121).

As described above, the ADC device and the digital slope ADC circuitry provided in some embodiments of the present disclosure combine the continuous-time comparator circuit with the noise shaping circuit, in order to meet requirements of low noise and high bandwidth.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An analog-to-digital converter (ADC) device, comprising:
    an ADC circuitry configured to generate a plurality of first bits and a first voltage according to an input signal; and
    a digital slope ADC circuitry configured to generate a second voltage at a node according to the first voltage and to gradually adjust the second voltage to generate a plurality of second bits,
    wherein after the plurality of second bits are generated, the digital slope ADC circuitry is further configured to perform a noise shaping function according to a first residual signal of the node, and the digital slope ADC circuitry is configured to calibrate the second voltage before the noise shaping function is performed.

2. The ADC device of claim 1, wherein the digital slope ADC circuitry comprises:
    a slope generator circuit configured to receive the first voltage according to a clock signal, and to output the second voltage to the node according to the first voltage, a reference voltage, and a plurality of switching signals;

a delay line circuit configured to generate the plurality of switching signals and a plurality of third bits according to an enable signal and a valid signal;

an encoder circuit configured to generate the plurality of second bits according to the plurality of third bits; and a comparator circuit configured to compare the second voltage with a predetermined voltage, in order to generate the valid signal.

3. The ADC device of claim 2, wherein the slope generator circuit comprises:

a capacitor array comprising a plurality of first capacitors and a second capacitor, wherein first terminals of the plurality of first capacitors are coupled to the node and are configured to receive the first voltage according to the clock signal, in order to store the received first voltage as the second voltage, second terminals of the plurality of first capacitors receive a plurality of control signals respectively, and the second capacitor is coupled to the node to store the first residue signal; and a switching circuit configured to generate the plurality of control signals according to the plurality of switching signals.

4. The ADC device of claim 2, wherein the delay line circuit comprises:

a logic gate configured to generate a first switching signal of the plurality of switching signals according to the enable signal and the valid signal;

a plurality of delay cells coupled in series and configured to generate remaining switching signals of the plurality of the switching signals according to the first switching signal;

a plurality of flip flops configured to be triggered by the valid signal, in order to output the plurality of switching signals as the plurality of third bits respectively; and a logic control circuit configured to calibrate the second voltage before the noise shaping function is performed.

5. The ADC device of claim 4, wherein the slope generator circuit comprises a capacitor array, the capacitor array is configured to store the first voltage as the second voltage, and before the noise shaping function is performed, the logic control circuit is configured to reset at least one capacitor of the capacitor array, in order to calibrate the second voltage.

6. The ADC device of claim 4, wherein the slope generator circuit comprises a compensation capacitor, and before the noise shaping function is performed, the logic control circuit is configured to output an adjustment voltage to the compensation capacitor, in order to calibrate the second voltage.

7. The ADC device of claim 2, wherein the enable signal is to indicate that the digital slope ADC circuitry starts performing an analog-to-digital conversion.

8. The ADC device of claim 2, wherein the valid signal is to indicate that the digital slope ADC circuitry finishes performing an analog-to-digital conversion.

9. The ADC device of claim 2, wherein the comparator circuit is configured to compare the second voltage with the predetermined voltage, in order to detect a zero crossing point of the second voltage.

10. The ADC device of claim 1, wherein the digital slope ADC circuitry comprises:

a comparator circuit configured to detect a zero crossing point of the second voltage, in order to generate the plurality of second bits; and a noise shaping circuit configured to output a second residue signal to the comparator circuit according to the first residue signal, in order to perform the noise shaping function.

11. The ADC device of claim 10, wherein the noise shaping circuit comprises:

a first capacitor;

a first switch coupled to the node and configured to be turned on according to a first control signal, in order transfer the first residue signal to the first capacitor;

a second capacitor coupled to the first switch and the comparator circuit; and a second switch configured to be turned on according to a second control signal to couple the first capacitor the second capacitor, in order to generate the second residue signal.

12. A digital slope ADC circuitry, comprising:

a slope generator circuit configured to output a voltage at a node according to a clock signal and an input signal;

a delay line circuit configured to generate a plurality of first bits according an enable signal and a valid signal and to generate a plurality of switching signals to the slope generator circuit, in order to gradually adjust the voltage;

a comparator circuit configured to detect a zero crossing point of the voltage, in order to generate the valid signal; and a noise shaping circuit configured to output a second residue signal to the comparator circuit according to a first residue signal of the node after the plurality of first bits are generated, in order to perform a noise shaping function, wherein the delay line circuit is configured to calibrate the voltage before the noise shaping function is performed.

13. The digital slope ADC circuitry of claim 12, wherein the slope generator circuit comprises a capacitor array, the delay line circuit comprises a logic control circuit, the capacitor array is configured to store the voltage, and the logic control circuit is configured to reset at least one capacitor of the capacitor array before the noise shaping function is performed, in order to calibrate the voltage.

14. The digital slope ADC circuitry of claim 12, wherein the slope generator circuit comprises:

a capacitor array, comprising a plurality of first capacitors and a second capacitor, wherein first terminals of the plurality of first capacitors are coupled to the node and are configured to store the voltage according to the clock signal and the input signal, second terminals of the plurality of first capacitors are configured to receive a plurality of control signals respectively, and the second capacitor is coupled to the node to store the first residue signal; and a switching circuit configured to generate the plurality of control signals according to the switching signals.

15. The digital slope ADC circuitry of claim 12, wherein the delay line circuit comprises:

a logic gate configured to generate a first switching signal of the plurality of switching signals according to the enable signal and the valid signal;

a plurality of delay cells coupled in series and configured to generate remaining switching signals of the plurality of the switching signals according to the first switching signal;

a plurality of flip flops configured to be triggered by the valid signal, in order to output the plurality of switching signals as the plurality of first bits respectively; and a logic control circuit configured to calibrate the voltage before the noise shaping function is performed.

16. The digital slope ADC circuitry of claim 15, further comprising:

an encoder circuit configured to generate a plurality of second bits according to the plurality of first bits.

17. The digital slope ADC circuitry of claim 15, wherein the slope generator circuit comprises a compensation capacitor, and the logic control circuit is configured to output an adjustment signal to the compensation capacitor before the noise shaping function is performed, in order to calibrate the voltage.

18. The digital slope ADC circuitry of claim 12, wherein the noise shaping circuit comprises:
   a first capacitor;
   a first switch coupled to the node and configured to be turned on according to a first control signal, in order to transfer the first residue signal to the first capacitor;
   a second capacitor coupled to the first switch and the comparator circuit; and
   a second switch configured to be turned on according to a second control signal to couple the first capacitor to the second capacitor, in order to generate the second residue signal.

19. The digital slope ADC circuitry of claim 11, wherein the enable signal is to indicate that an analog-to-digital conversion is started.

20. The digital slope ADC circuitry of claim 11, wherein the valid signal is to indicate that an analog-to-digital conversion is finished.

* * * * *